(12) United States Patent
Li

(10) Patent No.: US 11,539,009 B2
(45) Date of Patent: Dec. 27, 2022

(54) DISPLAY PANEL AND MANUFACTURING METHOD THEREOF, DISPLAY TERMINAL

(71) Applicant: Shenzhen China Star Optoelectronics Semiconductor Display Technology Co., Ltd., Guangdong (CN)

(72) Inventor: Linshuang Li, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 345 days.

(21) Appl. No.: 16/771,349

(22) PCT Filed: May 9, 2020

(86) PCT No.: PCT/CN2020/089359
§ 371 (c)(1),
(2) Date: Jun. 10, 2020

(87) PCT Pub. No.: WO2021/217700
PCT Pub. Date: Nov. 4, 2021

(65) Prior Publication Data
US 2021/0336167 A1 Oct. 28, 2021

(30) Foreign Application Priority Data
Apr. 26, 2020 (CN) .......................... 202010336733.8

(51) Int. Cl.
H01L 51/00 (2006.01)
H01L 27/32 (2006.01)
(Continued)

(52) U.S. Cl.
CPC ...... *H01L 51/0097* (2013.01); *H01L 23/4985* (2013.01); *H01L 25/167* (2013.01);
(Continued)

(58) Field of Classification Search
CPC ............. H01L 51/0097; H01L 23/4985; H01L 25/167; H01L 27/3244; H01L 2227/323; H01L 2251/5315
(Continued)

(56) References Cited

U.S. PATENT DOCUMENTS

2018/0074354 A1* 3/2018 Lee ........................ G02F 1/1339
2018/0145124 A1 5/2018 Kim et al.
(Continued)

FOREIGN PATENT DOCUMENTS

CN 110165076 A 8/2019
CN 110611042 A 12/2019
(Continued)

*Primary Examiner* — Xia L Cross

(57) ABSTRACT

The present application provides a display panel, a manufacturing method of the display panel, and a display terminal. The display panel includes a base substrate. The base substrate comprises a first substrate, a semi-interpenetrating net structure layer, and a second substrate stacked on each other. The semi-interpenetrating net structure layer is formed by curing after interpenetration between a material of the first substrate in a partially cured state and a material of the second substrate in an uncured state. Accordingly, a bonding strength between the first and second substrates is increased, inert properties between them are reduced, and production yields in separating a glass substrate from the first substrate are improved.

8 Claims, 3 Drawing Sheets

(51) Int. Cl.
*H01L 23/498* (2006.01)
*H01L 25/16* (2006.01)

(52) U.S. Cl.
CPC .... *H01L 27/3244* (2013.01); *H01L 2227/323* (2013.01); *H01L 2251/5315* (2013.01)

(58) Field of Classification Search
USPC .......................................................... 257/72
See application file for complete search history.

(56) References Cited

U.S. PATENT DOCUMENTS

2019/0072808 A1*  3/2019  Fujiwara ................. B32B 17/06
2021/0066623 A1   3/2021  Zhang

FOREIGN PATENT DOCUMENTS

| CN | 110854136 A | 2/2020 |
| CN | 110867462 A | 3/2020 |

* cited by examiner

DISPLAY PANEL AND MANUFACTURING METHOD THEREOF, DISPLAY TERMINAL

FIELD OF DISCLOSURE

The present invention relates to a field of display techniques and in particular, to a display panel and a manufacturing method thereof, a display terminal.

DESCRIPTION OF RELATED ART

In conventional techniques for manufacturing a flexible organic light-emitting diode (OLED) display panel, a flexible material is usually used to coat a rigid glass substrate to form a flexible substrate. Then, thin film transistors (TFTs), a display device layer, and an encapsulation layer are produced on the flexible substrate. Finally, the glass substrate is separated from the flexible substrate by a peeling process.

At present, commonly used flexible substrates include single-layer flexible substrates and double-layer flexible substrates. For a display panel with a single-layer flexible substrate structure, the flexible substrate is easily damaged during a peeling process for peeling a glass substrate from the flexible substrate due to the presence of particles on a surface of the glass substrate or between the glass substrate and the flexible substrate, resulting in the display panel's serious breakage and lowering production yields in the peeling process. For a display panel with a double-layer flexible substrate structure, although a lower-layer flexible substrate can be used to protect an upper-layer flexible substrate from damage, inert properties between the upper and lower flexible substrates lead to a risk of reducing a bonding strength between the upper and lower flexible substrates in repeated high and low temperature support steps for manufacturing the display panel, which causes the upper flexible substrate and the lower flexible substrate to be separated or even completely detached from each other, and accordingly seriously affects stability in a manufacturing process of the display panel and production yields in the subsequent peeling process.

In summary, in conventional display panels, inert properties between the upper and lower flexible substrates causes the upper flexible substrate and the lower flexible substrate to be separated or even completely detached from each other, which seriously affects the stability in the manufacturing process of the display panel and the production yields in the subsequent peeling process. Therefore, it is necessary to provide a display panel, a manufacturing method thereof, and a display terminal to improve this problem.

SUMMARY

The present disclosure provides a display panel, a manufacturing method thereof, and a display terminal to solve a problem in conventional techniques. The problem in conventional display panels are that inert properties between upper and lower flexible substrates causes separation or even complete detachment between the upper flexible substrate and the lower flexible substrate, which seriously affects stability in a manufacturing process of the display panel and production yields in a subsequent peeling process.

The present disclosure provides a display panel, comprising:
  a base substrate;
  a thin film transistor (TFT) array layer disposed on the base substrate; and
  a display device layer disposed on one side of the TFT array layer away from the base substrate;
  wherein the base substrate comprises a first substrate, a semi-interpenetrating net structure layer, and a second substrate stacked on each other, the semi-interpenetrating net structure layer is formed by curing after interpenetration between a material of the first substrate in a partially cured state and a material of the second substrate in an uncured state applied onto a surface of the first substrate.

According to one embodiment of the present disclosure, a plurality of wedge-shaped structures arranged in an array are disposed on one side of the first substrate adjacent to the second substrate, and one end of the wedge-shaped structure away from the first substrate is embedded in the second substrate.

According to one embodiment of the present disclosure, a cross-sectional shape of the wedge-shaped structure is trapezoidal or inverted trapezoidal.

According to one embodiment of the present disclosure, the wedge-shaped structures have at least two different heights, and the wedge-shaped structures with the same height are spaced between the wedge-shaped structures with different heights.

According to one embodiment of the present disclosure, the wedge-shaped structure is a single-layer structure made of silicon nitride or silicon oxide, or a stacked structure composed of silicon nitride and silicon oxide.

According to one embodiment of the present disclosure, the material of the first substrate and the material of the second substrate both comprise yellow polyimide.

The present disclosure provides a display terminal, comprising:
  a terminal body and a display panel, the display panel disposed on the terminal body, the display panel comprising:
    a base substrate;
    a thin film transistor (TFT) array layer disposed on the base substrate; and
    a display device layer disposed on one side of the TFT array layer away from the base substrate;
    wherein the base substrate comprises a first substrate, a semi-interpenetrating net structure layer, and a second substrate stacked on each other, the semi-interpenetrating net structure layer is formed by curing after interpenetration between a material of the first substrate in a partially cured state and a material of the second substrate in an uncured state applied onto a surface of the first substrate.

According to one embodiment of the present disclosure, a plurality of wedge-shaped structures arranged in an array are disposed on one side of the first substrate adjacent to the second substrate, and one end of the wedge-shaped structure away from the first substrate is embedded in the second substrate.

According to one embodiment of the present disclosure, a cross-sectional shape of the wedge-shaped structure is trapezoidal or inverted trapezoidal.

According to one embodiment of the present disclosure, the wedge-shaped structures have two different heights, and the wedge-shaped structures with the same heights are spaced between the wedge-shaped structures with different heights.

According to one embodiment of the present disclosure, the wedge-shaped structure is a single-layer structure made of silicon nitride or silicon oxide, or a stacked structure composed of silicon nitride and silicon oxide.

According to one embodiment of the present disclosure, the material of the first substrate and the material of the second substrate both comprise yellow polyimide.

The present disclosure provides a manufacturing method of a display panel, comprising following steps:

providing a glass substrate, and coating a surface of the glass substrate with a first substrate material;

heating the first substrate material to remove a solvent in the first substrate material, and heating the first substrate material again to partially cure the first substrate material;

coating a surface of the first substrate material in a partially cured state with a second substrate material, performing interpenetration and exchange between one side of the first substrate material adjacent to the second substrate material and the second substrate material; and heating the second substrate material to remove a solvent in the second substrate material, and heating again until the first substrate material and the second substrate material are completely cured to form a first substrate, a semi-interpenetrating net structure layer, and a second substrate.

According to one embodiment of the present disclosure, the manufacturing method further comprises following steps:

before applying the second substrate material, depositing an inorganic material on the surface of the first substrate material in the partially cured state, and then performing a photolithography process to form a plurality of wedge-shaped structures arranged in an array.

According to one embodiment of the present disclosure, the manufacturing method further comprises following steps:

forming a barrier layer, a thin film transistor (TFT) array layer, a display device layer, and an encapsulating layer sequentially on one side of the second substrate away from the first substrate; and peeling the glass substrate from the first substrate.

According to one embodiment of the present disclosure, the first substrate material and the second substrate material both comprise a yellow polygamic acid solution.

According to one embodiment of the present disclosure, a solid content of the first substrate material ranges from 8 wt % to 15 wt %, and a viscosity of the first substrate material ranges from 8000 cP to 15000 cP.

According to one embodiment of the present disclosure, a temperature for heating the first substrate material to remove the solvent in the first substrate material is lower than 120° C., and a temperature for heating the first substrate material to partially cure the first substrate material is lower than 250° C.

According to one embodiment of the present disclosure, the inorganic material comprises silicon nitride or silicon oxide, and the wedge-shaped structure is a single-layer structure made of silicon nitride or silicon oxide.

According to one embodiment of the present disclosure, the inorganic material comprises silicon nitride and silicon oxide, and the wedge-shaped structure is a stacked structure composed of silicon nitride and silicon oxide.

Advantages of the Present Disclosure

In the present disclosure, the semi-interpenetrating net structure layer is formed between the first substrate and the second substrate, and the wedge-shaped structures are arranged in an array between the first substrate and the second substrate, thus improving a bonding strength between the first substrate and the second substrate, reducing inert properties between the first substrate and the second substrate, reducing a risk of separation or even complete detachment between the first and second substrates, and at the same time improving production yields in separating a glass substrate from the first substrate in a peeling process.

BRIEF DESCRIPTION OF DRAWINGS

In order to more clearly illustrate the embodiments of the present disclosure or related art, figures which will be described in the embodiments are briefly introduced hereinafter. It is obvious that the figures are merely for the purposes of illustrating some embodiments of the present disclosure, and a person having ordinary skill in this field can obtain other figures according to these figures without inventive work.

DETAILED DESCRIPTION OF EMBODIMENTS

Figure 1:
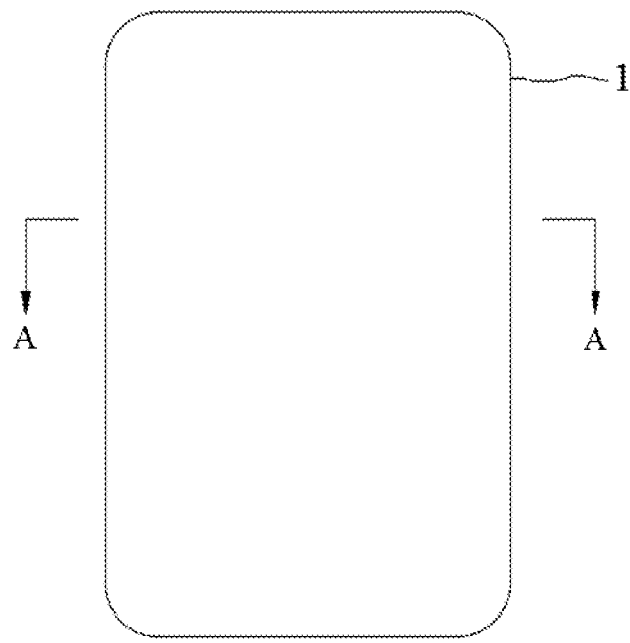
FIG. 1 is schematic plan view illustrating a display panel according to the present disclosure.

The following description is provided with reference to the accompanying drawings to illustrate specific embodiments in the present disclosure. Directional terms mentioned in this disclosure, such as "upper", "lower", "front", "rear", "left", "right", "inner", "outer", and "side", are for illustrative purposes only. Therefore, the directional terminology is used to illustrate and understand the present disclosure, but not to limit it. In the drawings, structurally similar components are denoted by the same reference numerals.

Figure 2:
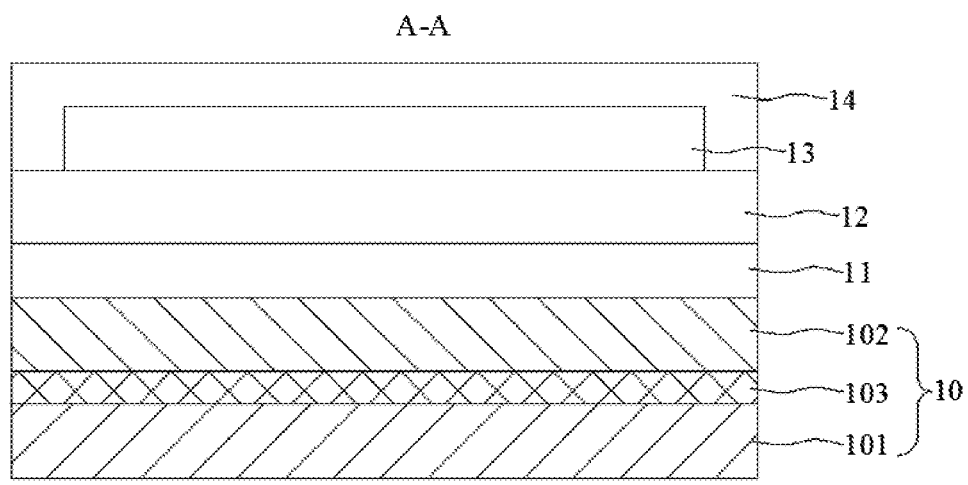
FIG. 2 is a schematic cross-sectional view, taken along an A-A direction in FIG. 1, illustrating the display panel according to one embodiment of the present disclosure.

The present disclosure is further described below in conjunction with the accompanying drawings and specific embodiments:

A display panel is provided according to one embodiment of the present disclosure, which is described in detail below with reference to FIGS. 1 and 2. As shown in FIGS. 1 and 2, FIG. 1 is a schematic plan view illustrating a display panel 1 according to one embodiment of the present disclosure, and FIG. 2 is a schematic cross-sectional view, taken along an A-A direction in FIG. 1, illustrating the display panel 1 according to one embodiment of the present disclosure. The display panel 1 comprises a base substrate 10, a barrier layer 11 disposed on the base substrate 10, a thin film transistor (TFT) array layer 12 disposed on one side of the barrier layer 11 away from the base substrate 10, a display device layer 13 disposed on one side of the TFT layer 12 away from the base substrate 10, and an encapsulating layer 14 covering the display device layer 13.

The display panel 1 of the present embodiment is an organic light-emitting diode display panel with a top-emission structure. A plurality of TFTs arranged in an array, a plurality of scan lines, and a plurality of data signal lines are disposed in the TFT array layer 12. The display device layer 13 comprises an anode, a light-emitting layer, and a cathode that are stacked on each other. The above structure is the same as a structure of a flexible organic light-emitting diode (OLED) display panel in conventional techniques, so a detailed description thereof is omitted herein for brevity. In addition, in some embodiments, the display panel 1 can also be a micro light-emitting diode (micro LED) display panel, and its structure is substantially the same as the OLED display panel of the present embodiment. The difference is that the display device layer 13 should include a plurality of micro LED devices arranged in an array. In addition, in other embodiments, the display panel 1 can also be a liquid crystal display panel or other flexible transparent display devices. In the case of the liquid crystal display panel, the display device layer 13 includes sub-pixel electrodes arranged in an array, the display panel 1 should also include a color filter substrate and a liquid crystal layer, and a structure of the base substrate 10 of the present embodiment is also applicable; however, the present disclosure is not limited in this regard.

As shown in FIG. 2, the base substrate 10 is a two-layer substrate structure, which includes a first substrate 101 and a second substrate 102 stacked on each other, and a semi-interpenetrating net structure layer formed between the first substrate 101 and the second substrate 102. The semi-interpenetrating net structure layer 103 is formed by curing after interpenetration and exchange between a material of the first substrate 101 in a partially cured state and a material of the second substrate 102 in an uncured state applied onto a surface of the first substrate. A semi-interpenetrating net structure in the semi-interpenetrating net structure layer 103 can increase a bonding strength between the first substrate 101 and the second substrate 102 and reduce inert properties between the first substrate 101 and the second substrate 102, thereby reducing a risk of separation or even detachment between the first substrate 101 and the second substrate 102 during subsequent manufacturing steps or bending processes. In addition to that, the base substrate 10 with the double-layer substrate structure can improve production yields in separating the base substrate 10 from the glass substrate in a peeling process.

In the present embodiment, the material of the first substrate 101 and the material of the second substrate 102 are both yellow polyimide, and the yellow polyimide has good thermal properties, with a small expansion coefficient and a high thermal decomposition temperature. Using yellow polyimide as the materials of the first substrate 101 and the second substrate 102 can improve stability in a process of forming the semi-interpenetrating network structure layer 103 by high-temperature heating and the subsequent manufacturing processes of the display panel.

In the present disclosure, a thickness of the first substrate 101 is 8 μm, and a thickness of the second substrate 102 is 5 μm, so as to ensure protection of the first substrate 101 while also ensuring that the first substrate 101 and the second substrate 102 have good flexibility. In some embodiments, the thickness of the first substrate 101 can also be 15 μm, and the thickness of the second substrate 102 can be 7 μm, which can also achieve good protection and flexibility. Certainly, the thickness of the first substrate 101 should range from 8 to 20 μm, and the thickness of the second substrate 102 should range from 5 to 8 μm. The specific thickness can be designed according to actual needs, and the present disclosure is not limited in this regard.

Figure 3:
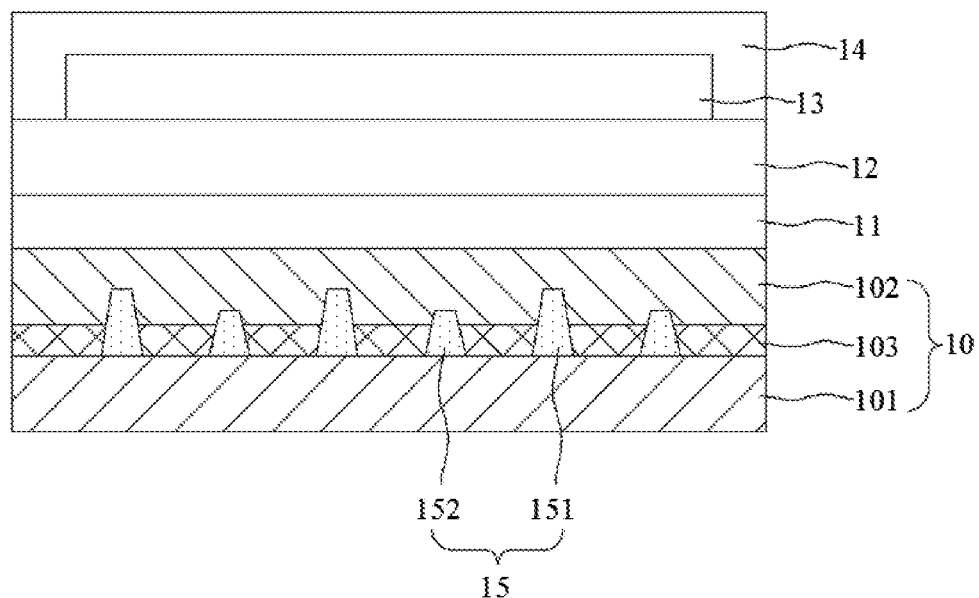
FIG. 3 is another schematic cross-sectional view illustrating the display panel along the A-A direction in FIG. 1 according to one embodiment of the disclosure.

The present disclosure further provides a display panel according to another embodiment. As shown in FIGS. 1 and 3, FIG. 3 is a schematic cross-sectional view taken along the A-A direction in FIG. 1 illustrating the display panel according to another embodiment of the present disclosure. The display panel of the present embodiment has substantially the same structure as the display panel of the foregoing embodiment, except that in the present embodiment, a plurality of wedge-shaped structures 15 arranged in an array are disposed on one side of the first substrate 101 adjacent to the second substrate 102, and one end of each wedge-shaped structure 105 away from the first substrate 101 penetrates the semi-interpenetrating network structure layer and is embedded in the second substrate 102. Accordingly, on the basis of having the semi-interpenetrating network structure layer 103, the bonding strength between the first substrate 101 and the second substrate 102 is further improved by the wedge-shaped structures 15, and the inert properties between the first substrate 101 and the second substrate 102 are also reduced to further reduce the risk of separation or even detachment between the first substrate 101 and the second substrate 102.

In the present disclosure, the cross-sectional shape of the wedge-shaped structure 15 along the A-A direction is trapezoidal, thereby increasing a contact area of the wedge-shaped structure 15 with the second substrate 102 and the semi-interpenetrating net structure layer 103, thus increasing the bonding strength between the semi-interpenetrating net structure layer 103 and the second substrate 102 reduces the inert properties between the first substrate 101 and the second substrate 102. Certainly, in some embodiments, the cross-sectional shape of the wedge-shaped structure 15 along the A-A direction can also be inverted trapezoidal, rectangular, or any other polygonal structure, which can achieve the same or similar technical effects as the above structure, and the present disclosure is not limited in this regard.

Optionally, the wedge-shaped structure 15 can be a single-layer structure made of silicon nitride or silicon oxide, or can be a stacked structure formed by stacking silicon nitride and silicon oxide. Certainly, the material of the wedge-shaped structure 15 is not limited to silicon nitride and silicon oxide, and can be other inorganic materials; the present disclosure is not limited in this regard.

Optionally, the wedge-shaped structures 15 have the same height, so as to reduce the difficulty in forming the wedge-shaped structures 15 through a photolithography process. In some embodiments, the wedge-shaped structures 15 have at least two different heights, and adjacent wedge-shaped structures of the same height are spaced between the wedge-shaped structures of different heights, thereby further increasing the bonding strength between the substrate 101 and the second substrate 102, and reducing the inert properties between the first substrate 101 and the second substrate 102.

Optionally, as shown in FIG. 3, the wedge-shaped structure 15 is composed of a primary wedge-shaped structure 151 and a secondary wedge-shaped structure 152 with different heights, wherein the height of the primary wedge-shaped structure 151 is greater than the height of the secondary wedge-shaped structure 152, and there is a secondary wedge-shaped structure 152 between each two adjacent primary wedge-shaped structures 151, so that the wedge-shaped structures with different heights are alternately arranged and spaced apart from each other on the first substrate 101, and the other end of the wedge-shaped structure is embedded in the second substrate 102, thereby further enhancing the bonding strength between the first substrate 101 and the second substrate 102 and reducing the inert properties between the first substrate 101 and the second substrate 102.

Furthermore, the height of the wedge-shaped structure 15 should be in a range from 2000 Å to 6000 Å, and the height of the primary wedge-shaped structure 151 is higher than the height of the secondary wedge-shaped structure 152 by 1000 Å. However, the specific height can be set according to the actual needs, and the present disclosure is not intended to limit the height.

Advantages of the present disclosure: The display panel of the present disclosure has the semi-interpenetrating net structure layer between the first substrate and the second substrate, and the wedge-shaped structures arranged in an array between the first substrate and the second substrate, thus improving the bonding strength between the first substrate and the second substrate, reducing the inert properties between the first substrate and the second substrate, reducing the risk of separation or even detachment between the first substrate and the second substrates, and also improving the production yields in separating the glass substrate from the first substrate in the peeling process.

Figure 4:
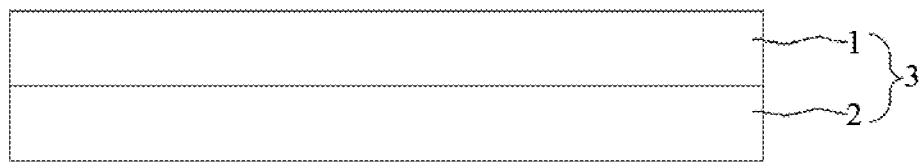
FIG. 4 is a schematic structural view illustrating a display terminal according to one embodiment of the present disclosure.

The present disclosure further provides a display terminal. As shown in FIG. 4, FIG. 4 is a schematic structural view illustrating a display terminal 3 according to one embodiment of the present disclosure. The display terminal 3 includes a terminal body 2 and a display panel 1. The display panel 1 is disposed on the terminal body 2. The terminal body 2 and the display panel 1 can be integrated as one, and the display panel 1 is the display panel of the above-mentioned embodiment. The display terminal 3 of the present embodiment can achieve the same technical effects as the display panel 1 of the above-mentioned embodiment, and a detailed description thereof is omitted herein for brevity.

Figure 5:
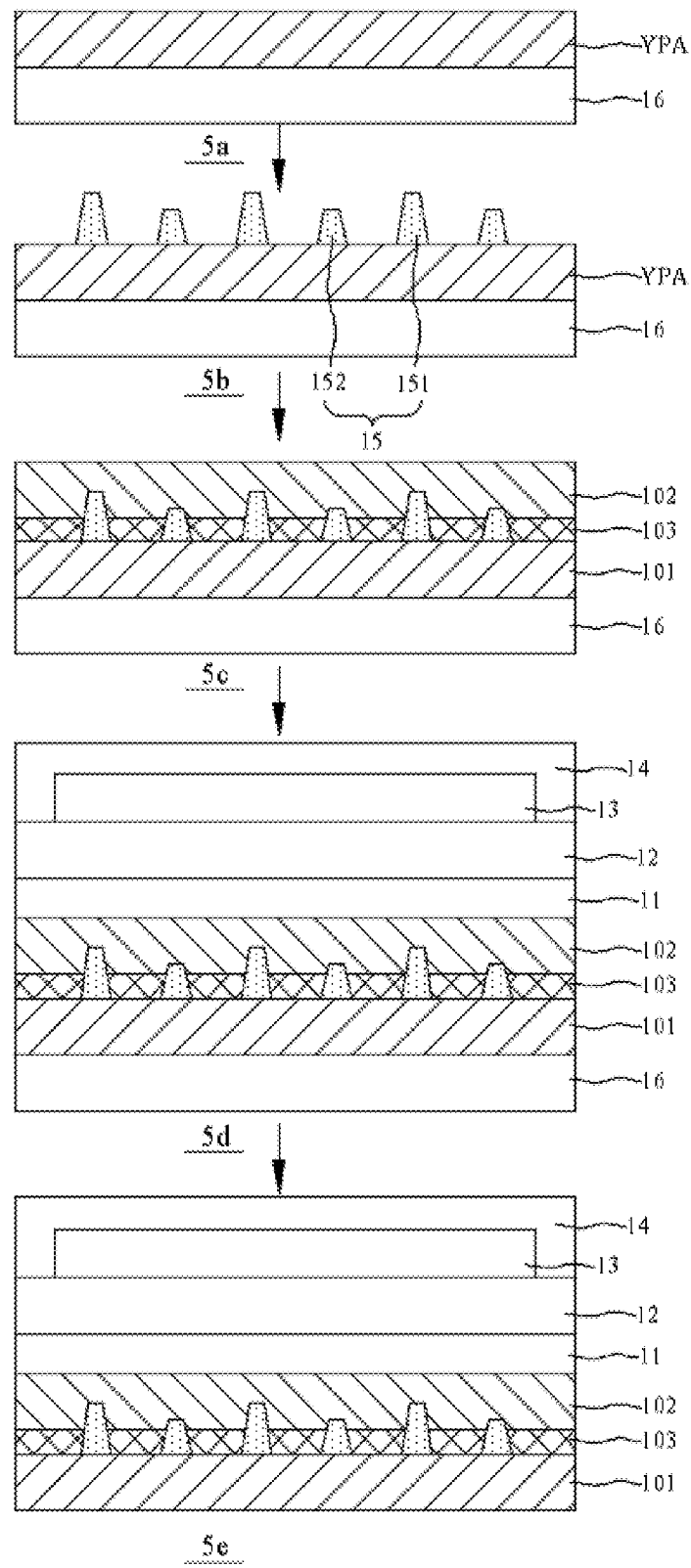
FIG. 5 is a process flow diagram illustrating a manufacturing method of the display panel according to one embodiment of the disclosure.

The present disclosure further provides a manufacturing method of a display panel, which will be described in detail below with reference to FIG. 5. As shown in FIG. 5, FIG. 5 is a schematic process flow diagram illustrating the manufacturing method of the display panel according to one embodiment of the present disclosure. The manufacturing method comprises:

Step S1: as shown in 5a of FIG. 5, providing a glass substrate 16, and coating a surface of the glass substrate 16 with a first substrate material YPA1;

Step S2: heating the first substrate material YPA1 to remove a solvent in the first substrate material YPA1, and heating the first substrate material YPA1 again to partially cure the first substrate material YPA1;

Step S3: coating a surface of the first substrate material YPA1 in a partially cured state with a second substrate material, performing interpenetration and exchange between one side of the first substrate material YPA1 adjacent to the second substrate material and the second substrate material; and Step S4: as shown in 5c of FIG. 5, heating the second substrate material to remove a solvent in the second substrate material, and heating again the first substrate material YPA1 and the second substrate material until they are completely cured to form a first substrate 101, a semi-interpenetrating net structure layer 103, and a second substrate 102.

Step S5: as shown in 5d of FIG. 5, forming a barrier layer 11, a thin film transistor (TFT) array layer 12, a display device layer 13, and an encapsulating layer 14 sequentially on one side of the second substrate 102 away from the first substrate 101; and Step S6: as shown in 5e of FIG. 5, peeling the glass substrate 16 from the first substrate 101 through a laser peeling process.

Specifically, in step S1, the first substrate material YPA1 is a yellow polyamic acid solution, and the yellow polyamic acid solution is a copolymerized polyamic acid solution, which is synthesized in a polar aprotic solvent at low temperature. In the present embodiment, the polar aprotic solvent can be one of nitrogen methylpyrrolidone (NMP), dimethylformamide (DMF) or dimethylacetamide (DMAC).

In the present embodiment, a solid content of the first substrate material YPA1 is 10 wt %, so viscosity of the first substrate material YPA1 is moderate, and the convenience and uniformity of applying the first substrate material YPA1 are ensured. In other embodiments, the solid content of the first substrate material YPA1 should be in a range from 8 wt % to 15 wt %, so that the viscosity of the first substrate material YPA1 ranges from 8000 cP to 15000 cP, so as to ensure the convenience and uniformity of applying the first substrate material YPA1. The specific numbers can be set according to actual needs, and the present disclosure is not limited in this regard.

Specifically, in step S2, a temperature at which the first substrate material YPA1 is heated for the first time to remove the solvent in the solution is 100° C., and a temperature for the second heating to pre-cure the first substrate material YPA1 is 230° C. This way, the solvent removal temperature and the pre-curing temperature is not too high to cause a too fast solvent removal speed of the first substrate material YPA1, which results in excessive holes inside the first substrate 101 to impede the subsequent formation of the semi-interpenetrating net structure layer 103. In some embodiments, the temperature for the first heating to remove the solvent should be lower than 120° C., and the temperature for the second heating for pre-curing should be lower than 250° C. to meet pre-curing requirements for the first substrate material YPA1; however, settings can be adjusted according to the actual needs, and the present disclosure is not limited in this regard.

In step S2, a curing degree of the first substrate material YPA1 in the partially cured state is 60%, so as to avoid the curing degree of the first substrate material YPA1 being too high and causing the first substrate material YPA1 to harden, and thereby failing to form the semi-interpenetrating net structure layer 103. In some embodiments, the curing degree of the first substrate material YPA1 can be in a range from 50% to 70% to meet the needs for subsequent manufacturing processes. In practice, the curing degree can be adjusted according to actual needs, and the present disclosure is not limited in this regard. Furthermore, a residual solvent content of the first substrate material YPA1 in the partially cured state in step S2 should be less than 30 wt %, so as to facilitate molecular movement between the first substrate material and the second substrate material during the subsequent formation of the semi-interpenetrating net structure layer 103, thereby further facilitating interpenetration and exchange between amic acid in the partially cured first substrate material YPA1 and the second substrate material, thus further increasing the bonding strength between the first substrate 101 and the second substrate 102.

Specifically, in step S3, the second substrate material is a yellow polyamic acid solution, the yellow polyamic acid solution is a copolymerized polyamic acid solution. In the present embodiment, the first substrate material YPA1 and the second substrate material are the same copolymerized polyamic acid solution. Certainly, in some embodiments, the first substrate material YPA1 and the second substrate material can also be different kinds of copolymerized polyamic acid solutions, and the present disclosure is not limited in this regard.

In step S4, conditions for the first heating to remove the solvent in the second substrate material are the same as conditions for removing the solvent in step S2. A temperature of heating the first substrate material YPA1 and the second substrate material in step S4 should be greater than 400° C., and thermal expansion coefficients of the first substrate material YPA1 and the second substrate material should be less than 10 ppm/° C., so that the first substrate material YPA1 and the second substrate material are completely cured by thermal imidization to form the first substrate 101, the semi-interpenetrating net structure layer 103, and the second substrate 102. The bonding strength between the first substrate 101 and the glass substrate 16 thus formed should be greater than 6N/cm, and the bonding strength between the semi-interpenetrating net structure layer 103 and the first substrate 101 and the bonding strength between the semi-interpenetrating net structure layer 103 and the second substrate 102 should be greater than 8N/cm.

In step S5, a film formation temperature of the barrier layer 11 is 280° C. The barrier layer 11 is mainly used to prevent moisture and oxygen from entering the TFT array layer 12. In other embodiments, the film formation temperature of the barrier layer 11 only needs to be lower than 300° C. The specific temperatures can be set according to actual needs, and hence are not limited here. In step S5, the maximum temperature in a process of forming the TFT array layer 12 should be 350° C., so as to maintain the bonding strength between the first substrate 101 and the glass substrate 16 and the bonding strength between the first substrate 101 and the second substrate 102 during the process.

The display panel manufactured by using the present embodiment is an organic light-emitting diode display panel with a top-emission structure. The display device layer 13 includes an anode, a light-emitting layer, and a cathode which are stacked on each other. Certainly, in some embodiments, the display device layer 13 can also be a plurality of micro light-emitting diode (micro LED) devices arranged in an array, so the present embodiment can also be used in manufacturing the micro LED display panels. In addition, for other flexible display panels such as flexible liquid crystal display panels, the manufacturing method of the display panel of the present embodiment is also applicable, so a detailed description is not repeated herein for brevity.

The manufacturing method in the present embodiment further comprises:

As shown in 5b of FIG. 5, before performing step S3 to apply the second substrate material, depositing by a chemical vapor deposition method an inorganic material on the surface of the first substrate material YPA1 in the partially cured state, and then performing a photolithography process to form a plurality of wedge-shaped structures 15 in an array. After performing the above steps, a coating of the second substrate material is applied, so that one end of the wedge-shaped structure 15 away from the first substrate 101 is embedded in the second substrate 102, thereby further increasing the bonding strength between the first substrate 101 and the second substrate 102 and reducing inert properties between the first substrate 101 and the second substrate 102.

Optionally, the wedge-shaped structures 15 can be a single layer structure made of silicon nitride or silicon oxide, or may be a stacked structure formed by stacking silicon nitride and silicon oxide. Certainly, the inorganic material is not limited to silicon nitride and silicon oxide, and can also be other inorganic materials, which is not limited here.

Advantages of the present embodiment: In the manufacturing method of the display panel according to the present embodiment, the semi-interpenetrating net structure layer is formed between the first substrate and the second substrate, and the wedge-shaped structures are arranged in an array between the first substrate and the second substrate, thereby improving the bonding strength between the first substrate and the second substrate, reducing the inert properties between the first substrate and the second substrate, reducing a risk of separation or even complete detachment between the first and second substrates, and improving production yields in separating the glass substrate from the first substrate in a laser peeling process.

In summary, although the present disclosure is disclosed as above with preferable embodiments, the above preferable embodiments are not intended to limit the present disclosure. Those of ordinary skill in the art can make modifications and changes without departing from the spirit and scope of the present disclosure. Such modifications and changes should be deemed to be within the protection scope of the present disclosure defined by the appended claims.

What is claimed is:

1. A manufacturing method of a display panel, comprising following steps:
   providing a glass substrate, and coating a surface of the glass substrate with a first substrate material;
   heating the first substrate material to remove a solvent in the first substrate material, and heating the first substrate material again to partially cure the first substrate material;
   coating a surface of the first substrate material in a partially cured state with a second substrate material, performing interpenetration and exchange between one side of the first substrate material adjacent to the second substrate material and the second substrate material;
   and heating the second substrate material to remove a solvent in the second substrate material, and heating again until the first substrate material and the second substrate material are completely cured to form a first substrate, a semi-interpenetrating net structure layer, and a second substrate.

2. The manufacturing method of the display panel according to claim 1, further comprising following steps:
   before applying the second substrate material, depositing an inorganic material on the surface of the first substrate material in the partially cured state, and then performing a photolithography process to form a plurality of wedge-shaped structures arranged in an array.

3. The manufacturing method of the display panel according to claim 2, wherein the inorganic material comprises silicon nitride or silicon oxide, and the wedge-shaped structure is a single-layer structure made of silicon nitride or silicon oxide.

4. The manufacturing method of the display panel according to claim 2, wherein the inorganic material comprises silicon nitride and silicon oxide, and the wedge-shaped structure is a stacked structure composed of silicon nitride and silicon oxide.

5. The manufacturing method of the display panel according to claim 1, further comprising following steps:
   forming a barrier layer, a thin film transistor (TFT) array layer, a display device layer, and an encapsulating layer sequentially on one side of the second substrate away from the first substrate; and
   peeling the glass substrate from the first substrate.

6. The manufacturing method of the display panel according to claim 1, wherein the first substrate material and the second substrate material both comprise a yellow polyamic acid solution.

7. The manufacturing method of the display panel according to claim 6, wherein a solid content of the first substrate material ranges from 8 wt % to 15 wt %, and a viscosity of the first substrate material ranges from 8000 cP to 15000 cP.

8. The manufacturing method of the display panel according to claim 1, wherein a temperature for heating the first substrate material to remove the solvent in the first substrate material is lower than 120° C., a temperature for heating the first substrate material to partially cure the first substrate material is lower than 250° C.

\* \* \* \* \*